(12) United States Patent
Hasegawa

(10) Patent No.: US 8,721,372 B2
(45) Date of Patent: May 13, 2014

(54) CONTACT AND ELECTRICAL CONNECTING APPARATUS

(75) Inventor: Yoshiei Hasegawa, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 43 days.

(21) Appl. No.: 13/503,877

(22) PCT Filed: Feb. 5, 2010

(86) PCT No.: PCT/JP2010/051675
§ 371 (c)(1),
(2), (4) Date: Apr. 25, 2012

(87) PCT Pub. No.: WO2011/096067
PCT Pub. Date: Aug. 11, 2011

(65) Prior Publication Data
US 2012/0214356 A1 Aug. 23, 2012

(51) Int. Cl.
*H01R 13/24* (2006.01)
(52) U.S. Cl.
USPC .......................................... 439/701; 439/66
(58) Field of Classification Search
USPC .................................................. 439/700, 66
See application file for complete search history.

(56) References Cited

U.S. PATENT DOCUMENTS

| 6,396,293 B1 | 5/2002 | Vinther et al. |
| 6,506,082 B1 * | 1/2003 | Meek et al. ................. 439/700 |
| 7,025,602 B1 * | 4/2006 | Hwang ........................ 439/66 |
| 7,467,952 B2 * | 12/2008 | Hsiao et al. .................. 439/66 |
| 7,789,671 B2 * | 9/2010 | Hsieh et al. .................. 439/66 |
| 7,845,988 B2 * | 12/2010 | Hsiao et al. ................. 439/700 |
| 7,862,391 B2 * | 1/2011 | Johnston et al. ............ 439/824 |
| 7,946,855 B2 * | 5/2011 | Osato ............................ 439/66 |
| 8,231,416 B2 * | 7/2012 | Johnston et al. ............ 439/824 |
| 2012/0214356 A1 * | 8/2012 | Hasegawa ................... 439/817 |

FOREIGN PATENT DOCUMENTS

| JP | 11-317270 A | 11/1999 |
| JP | 2004-152495 A | 5/2004 |
| JP | 2008-032743 A | 2/2008 |
| WO | WO 2006/041807 A2 | 4/2006 |
| WO | WO 2008/136396 A1 | 11/2008 |

* cited by examiner

*Primary Examiner* — James Harvey
(74) *Attorney, Agent, or Firm* — Bacon & Thomas, PLLC

(57) ABSTRACT

Respective plungers are slidably supported in a stable manner without fluctuation, and reliable electrical contact is achieved.

In a contact of the present invention, a first plunger and a second plunger include tip end portions provided on tip end sides, slidably supported, and contacting two respective members and sliding portions provided on proximal end sides, formed in halved shapes of the respective plungers, slidably overlapped with each other, and inserted in a compression coil spring. Each of the sliding portions is set to have a length to be slidably supported together with the tip end portion of the other plunger.

9 Claims, 19 Drawing Sheets

FIG.4A PRIOR ART
FIG.4B PRIOR ART
FIG.4C PRIOR ART
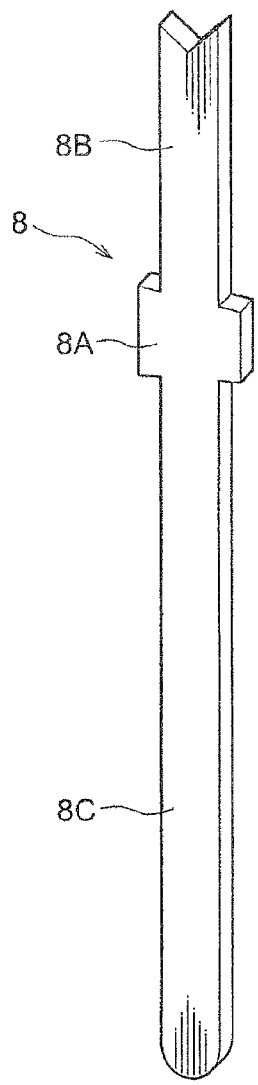
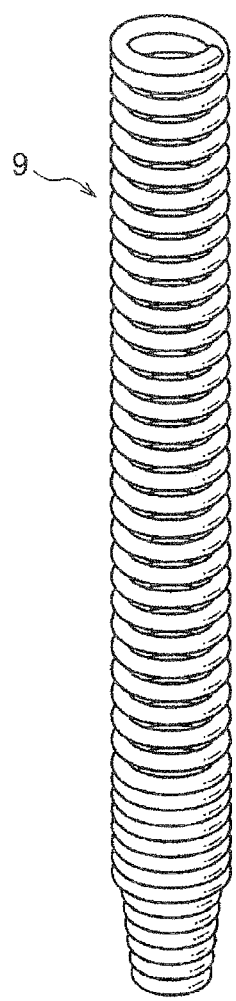
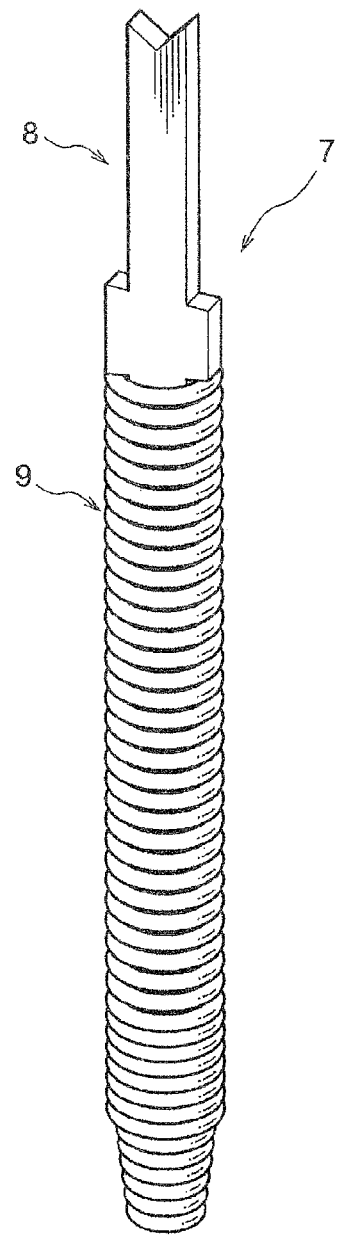

CONTACT AND ELECTRICAL CONNECTING APPARATUS

TECHNICAL FIELD

The present invention relates to a contact that contacts an electrode provided on a wiring board, a semiconductor integrated circuit, or the like and an electrical connecting apparatus.

BACKGROUND ART

A contact that electrically connects to each other electrical circuits or the like of wiring boards disposed to be opposed to each other is generally known. Examples of such a contact are ones described in Patent Document 1 and Patent Document 2.

A contact 1 in Patent Document 1 includes two contact pins 2 having equal shapes and a coil spring 3 as shown in FIGS. 2 and 3.

The contact pin 2 mainly includes locking claws 4, a locking hole 5, a flange portion 6, and a pin tip end portion 2A. Two locking claws 4 are provided to be opposed to each other and are supported by resilient supporting bar portions 4A. This allows the two locking claws 4 to approach to and separate from each other. The locking hole 5 is a hole in which the locking claws 4 are fitted and is formed in a rectangular shape so as to be matched with the width of each locking claw 4. Thus, by making the two contact pins 2 opposed to each other to be displaced by 90 degrees and fitted in each other, two pairs of locking claws 4 are respectively locked in the openings of the locking holes 5 to be prevented from falling off. The flange portion 6 is a part on which the coil spring 3 is to abut. By making the two contact pins 2 displaced by 90 degrees and fitted in each other in a state of being inserted in the coil spring 3, both ends of the coil spring 3 abut on the respective flange portions 6 to assemble the contact 1. Both ends of the contact 1 assembled in a state where the two contact pins 2 are fitted in each other are the pin tip end portions 2A that contact electrodes or the like and are electrically connected to them.

Also, a contact 7 in Patent Document 2 includes a plunger 8 and a spring 9 as shown in FIG. 4.

The plunger 8 is formed in an elongated plate shape and is provided at the upper portion with a broad portion 8A receiving the spring 9, and at the upper portion of this broad portion 8A is formed a terminal portion 8B contacting an electrode. At the lower portion of the broad portion 8A is formed a core bar portion 8C inserted in the spring 9 to be movable up and down. The spring 9 is formed to have an inside diameter that allows the core bar portion 8C to be inserted to be movable up and down. The lower end portion of the spring 9 is tapered to contact an electrode or the like.

Also, there is one having a structure as in Patent Document 3. A socket for an electrical component in Patent Document 3 has a contact member contacting a terminal of an electrical component, a board conducting member made of a conductive plate material and connected to a printed circuit board, and a coil spring disposed between the contact member and the board conducting member for conduction between them. The contact member and the board conducting member do not contact each other and are connected with the coil spring in-between.

Patent Document 1: Japanese Patent National Publication No. 2008-516398
Patent Document 2: Japanese Patent Laid-Open No. 2004-152495
Patent Document 3: Japanese Patent Laid-Open No. H11-317270

DISCLOSURE OF THE INVENTION

Problems to be Solved by the Invention

Meanwhile, in the contact 1 in Patent Document 1 described above, in a state where the locking claws 4 of one contact pin 2 are fitted in the locking hole 5 of the other contact pin 2, the respective supporting bar portions 4A are supported by the coil spring 3. Along with expansion and contraction of the contact 1, the respective supporting bar portions 4A slide each other in a state of being supported by the coil spring 3. However, in this case, since the respective supporting bar portions 4A are just supported by the coil spring 3, there is a problem in which the respective supporting bar portions 4A become loose and unstable each other due to changes in inside diameter of the coil spring 3 caused by elasticity, and thus the respective contact pins 2 cannot slide accurately and favorably.

In particular, operations of the respective contact pins 2 require high accuracy when size reduction of the contact 1 is advanced along with high integration of a circuit, but a structure in which the respective supporting bar portions 4A are supported by the coil spring 3 causes a problem in which the respective contact pins 2 cannot slide accurately and favorably, and a contact failure may occur.

Also, in the contact 7 in Patent Document 2, the inside diameter of the spring 9 is set to a dimension that allows the core bar portion 8C of the plunger 8 to be inserted to be movable up and down, but there is a problem in which the plunger 8 becomes loose and unstable due to changes in inside diameter of the spring 9 caused by elasticity and cannot slide accurately and favorably.

Especially, since the contact 7 in Patent Document 2 contacts the respective electrodes by the terminal portion 8B of the plunger 8 on one side and by the spring 9 on the other side, there is a problem in which a contact state between the spring 9 and the electrode on the other side becomes unstable, and a contact failure occurs highly possibly due to the looseness of the plunger 8 as well.

Further, in the case of Patent Document 3, since the plungers do not contact each other and just electrically contact each other by the spring, there is a problem in which the respective plungers become unstable, and a contact failure may occur.

The present invention has been made in view of such problems, and an object of the present invention is to provide a contact achieving an accurate and favorable slide and improving contact characteristics and an electrical connecting apparatus using this contact.

Means to Solve the Problems

A contact according to the present invention is made to solve the above problems and comprises a first plunger contacting one member, a second plunger contacting the other member in a state of being overlapped with the first plunger and conducting electricity between the one member and the other member in cooperation with the first plunger, and a compression coil spring covering outer circumferences of the first plunger and the second plunger overlapped with each other and supporting the respective plungers relatively slidably, wherein the first plunger and the second plunger include tip end portions provided on tip end sides, slidably supported, and contacting the respective members and sliding portions provided on proximal end sides, formed in halved shapes of the respective plungers, slidably overlapped with each other, and inserted in the compression coil spring, and wherein each of the sliding portions is set to have a length to be slidably supported together with the tip end portion of the other plunger.

An electrical connecting apparatus contacting electrodes of a device under test and performing a test comprises contacts disposed at positions corresponding to the respective electrodes of the device under test and contacting the respective electrodes for electrical conduction, wherein as the contacts are used the aforementioned contacts.

Effect of the Invention

In the contact and the electrical connecting apparatus according to the present invention, the respective plungers are slidably supported in a stable manner without fluctuation, and reliable electrical contact is achieved.

BRIEF DESCRIPTION OF THE DRAWINGS

FIG. 4 is a perspective view showing a second conventional contact.

EXPLANATIONS OF REFERENCE NUMERALS

Figure 1:
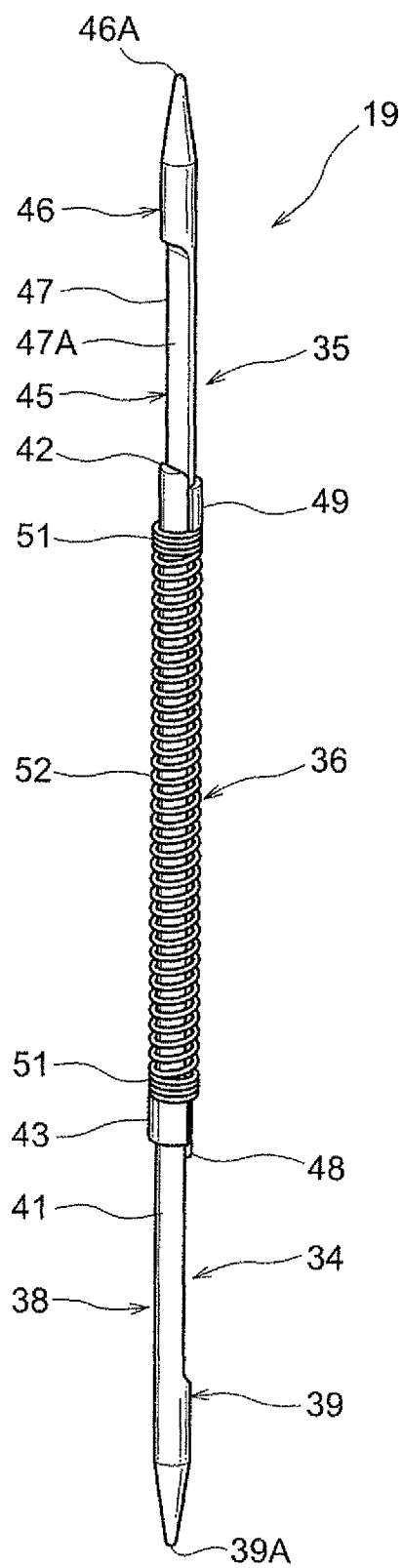
FIG. 1 is a perspective view showing a contact according to an embodiment of the present invention.
Figure 2:
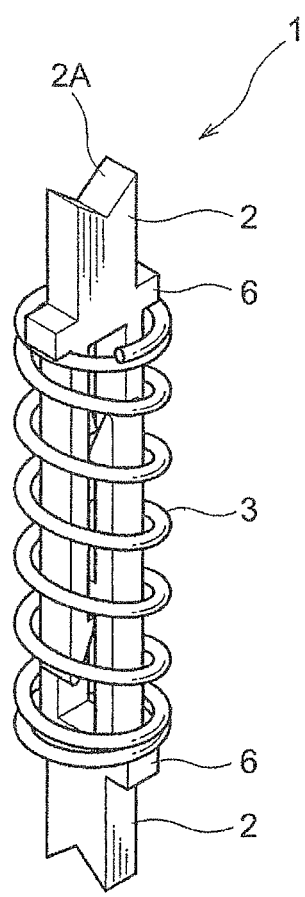
FIG. 2 is a perspective view showing a first conventional contact.
Figure 3:
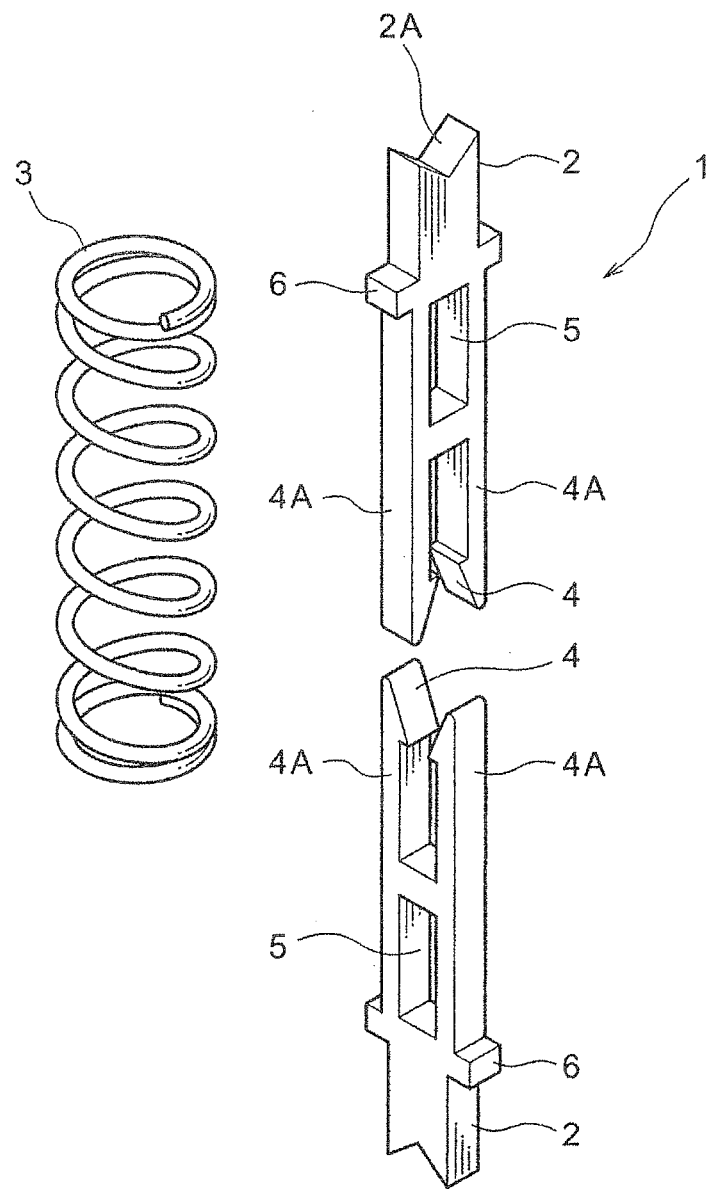
FIG. 3 is an exploded perspective view showing the first conventional contact.
Figure 5:
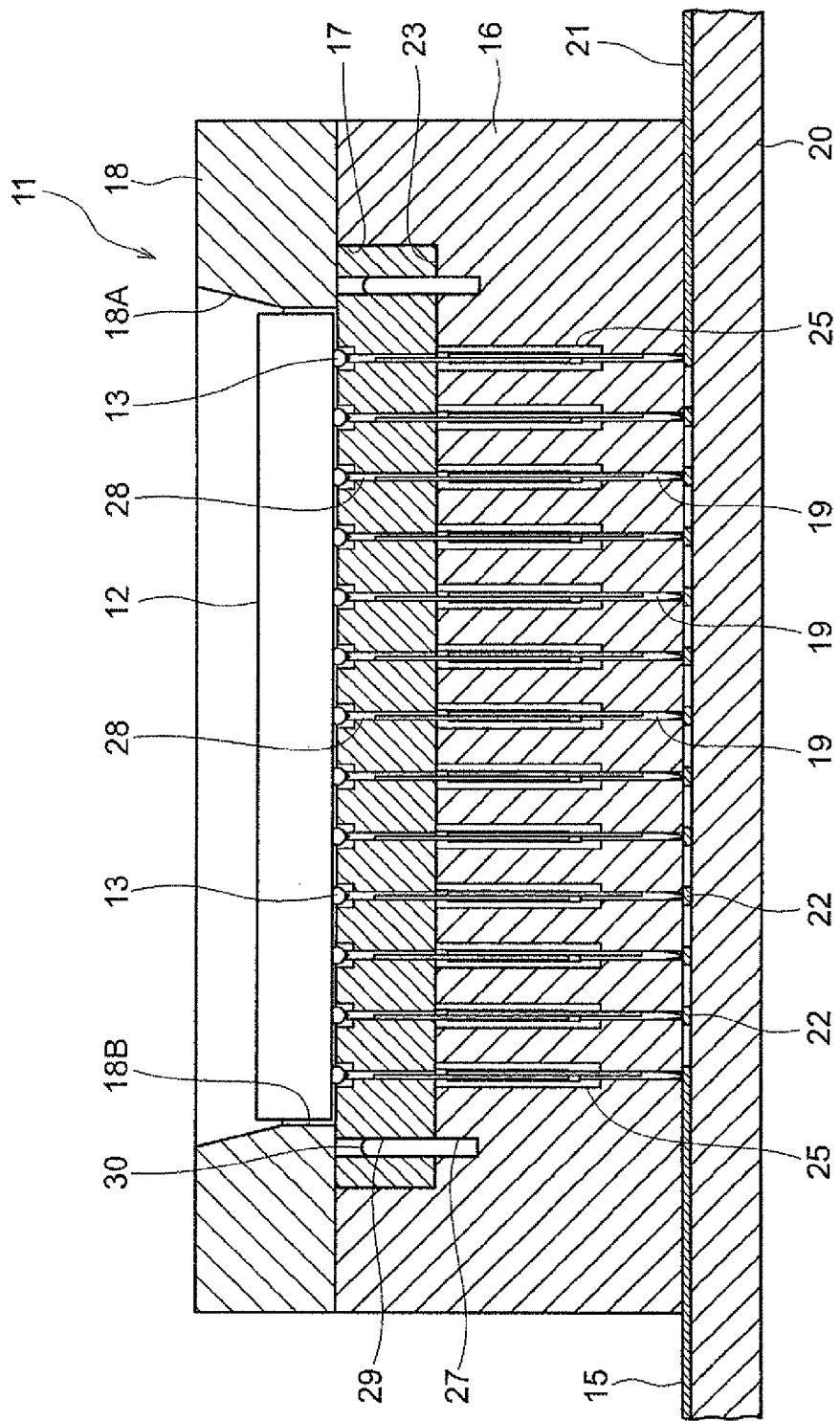
FIG. 5 is a front cross-sectional view showing an electrical connecting apparatus according to an embodiment of the present invention.
Figure 6:
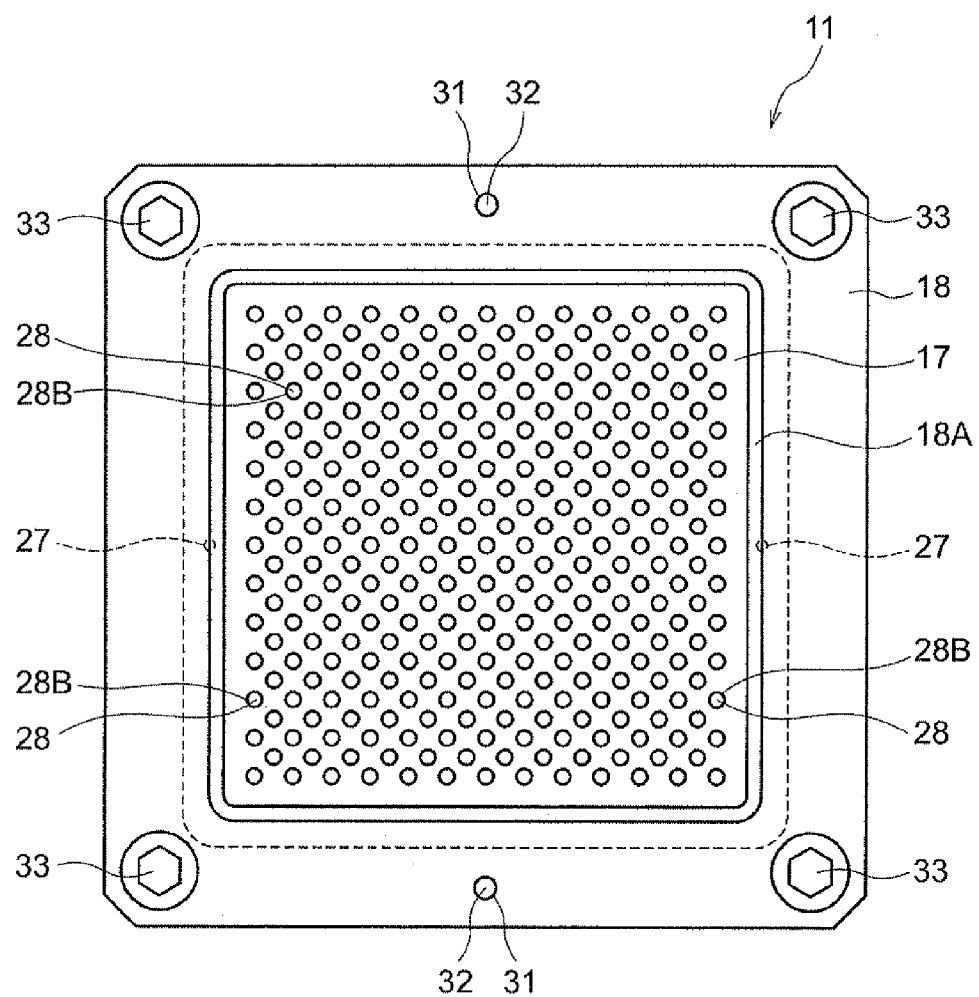
FIG. 6 is a plan view showing the electrical connecting apparatus according to the embodiment of the present invention.
Figure 7:
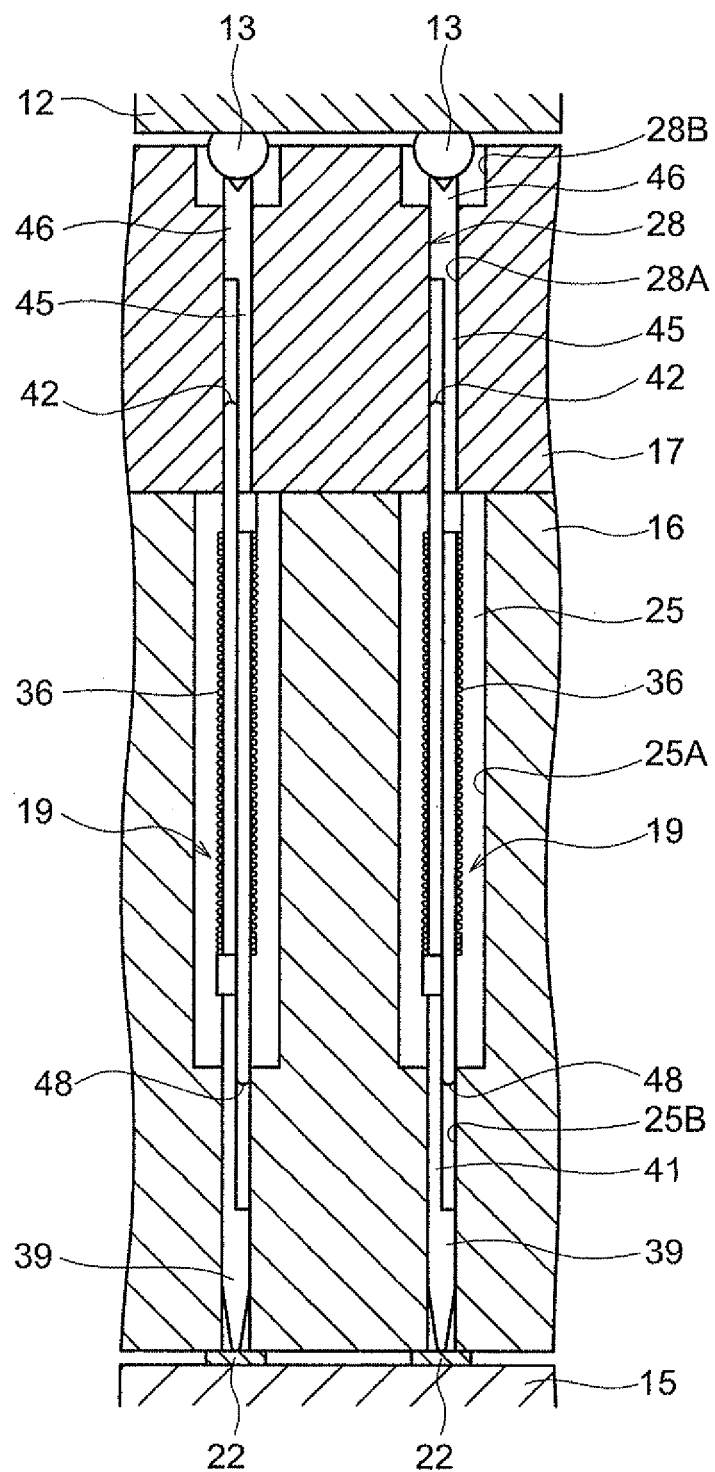
FIG. 7 is a cross-sectional view showing a main part of the electrical connecting apparatus according to the embodiment of the present invention.

11: electrical connecting apparatus, 12: device under test, 13: bump electrode, 15: wiring board, 16: housing, 17: upper plate, 18: guide plate, 18A: inclined surface portion, 18B: abutting surface portion, 19: contact, 20: substrate (board), 21: wire, 22: contact pad, 23: upper plate fitting recess portion, 25: supporting hole, 25A: intermediate hole portion, 25B: board-side guide hole portion, 27: pin hole, 28: device-under-test-side supporting hole, 28A: device-under-test-side guide portion, 28B: electrode guide hole portion, 29: pin hole, 30: positioning pin, 31: pin hole, 32: positioning pin, 33: penetrating bolt, 34: board-side plunger, 35: device-under-test-side plunger, 36: compression coil spring, 38: sliding portion, 39: tip end portion, 39A: contact end portion, 41: sliding bar portion, 41A: sliding surface portion, 42: rear end inserting portion, 42A: linear chamfered portion, 42B: R chamfered portion, 43: stopper, 45: sliding portion, 46: tip end portion, 46A: contact end portion, 47: sliding bar portion, 47A: sliding surface portion, 48: rear end inserting portion, 49: stopper, 51: close-contact winding portion, 52: spring portion

BEST MODE FOR CARRYING OUT THE INVENTION

Hereinafter, a contact and an electrical connecting apparatus according to embodiments of the present invention will be described with reference to the attached drawings.

First, an electrical connecting apparatus 11 of the present embodiment will be described based on FIGS. 5 to 8. The electrical connecting apparatus 11 is an apparatus for use in an electrical test or the like of a device under test 12. The device under test 12 is a semiconductor device such as an integrated circuit or another device that requires an electrical test. The device under test 12 is provided on the lower side surface with a plurality of bump electrodes 13. The bump electrodes 13 are spherical electrodes provided on the lower side surface of the device under test 12. The respective bump electrodes 13 are arranged on the lower side surface of the device under test 12 in a single line, in plural lines, in a matrix form, or in another arrangement. It is to be noted that, in the present embodiment, the respective bump electrodes 13 are arranged in a matrix form. There is a case in which planar electrodes are provided instead of the spherical bump electrodes 13. In accordance with the shape of the electrode, an after-mentioned contact end portion is cut in a crown shape or is formed in a conical shape. Therefore, both cases of the contact end portion formed in a crown shape and in a conical shape are described as examples in the following.

The electrical connecting apparatus 11 is mainly configured to include a wiring board 15, a housing 16, an upper plate 17, a guide plate 18, and contacts 19.

The wiring board 15 is a plate-shaped member arranged on a thick substrate 20 and supported integrally with the housing 16, the upper plate 17, and the like. Wires 21 of this wiring board 15 are connected to wires of a tester main body (not shown) testing the device under test. The wiring board 15 is a member constituting electrodes on the side of the tester main body. The lower end portions of the contacts 19 contact contact pads 22 of the wires 21 on the wiring board 15 for electrical conduction between the contacts 19 and the tester main body side.

The housing 16 is a member to support the contacts 19 in cooperation with the upper plate 17. The housing 16 is entirely formed in a thick quadrangular block shape and on an upper side surface thereof an upper plate fitting recess portion 23 is formed. This upper plate fitting recess portion 23 is set to have approximately equal height, width, and depth dimensions to those of the upper plate 17. Thus, the upper plate 17 is set to be fitted in the upper plate fitting recess portion 23 to cause the upper side surface of the housing 16 and the upper side surface of the upper plate 17 to be coplanar. The housing 16 is provided with multiple supporting holes 25 in a matrix form. Each of these supporting holes 25 is a hole to allow the contact 19 to be inserted and supported therein. The supporting holes 25 are provided at corresponding positions to the bump electrodes 13 of the device under test 12 and the contact pads 22 of the wiring board 15, respectively. Each supporting hole 25 consists of an intermediate hole portion 25A and a board-side guide hole portion 25B. The intermediate hole portion 25A is set to have a larger inside diameter than the outside diameter of the contact 19 so as to prevent the contact 19 from contacting it. The board-side guide hole portion 25B is set to have an approximately equal inside diameter dimension to that of an after-mentioned tip end portion 39 of a board-side plunger 34 of the contact 19. This enables the tip end portion 39 of the board-side plunger 34 to be inserted and supported in the board-side guide hole portion 25B and enables the board-side plunger 34 to slide up and down in a stable manner without fluctuation. The rim portion of the upper plate fitting recess portion 23 of the housing 16 is provided at two locations with pinholes 27 to allow after-mentioned positioning pins 30 to be inserted therein.

The housing 16 is piled and fixed on the upper side of the wiring board 15. The contact pads 22 on the upper side surface of the wiring board 15 provided at corresponding positions to the board-side guide hole portions 25B are connected to the tester main body by the wires. On each contact pad 22 is thrust a contact end portion 39A of the board-side plunger 34 inserted in the board-side guide hole portion 25B for electrical contact.

The upper plate 17 is a member to support the contacts 19 entirely in cooperation with the housing 16. The upper plate 17 is adapted to support the contacts 19 to enable the contacts 19 to expand and contract by this housing 16 and the upper plate 17 in a state of being fitted in the upper plate fitting recess portions 23 of the housing 16. The upper plate 17 is provided at positions corresponding to the respective supporting holes 25 of the housing 16 with device-under-test-side supporting holes 28 supporting the side of the device under test 12 of the contact 19. Each device-under-test-side supporting hole 28 consists of a device-under-test-side guide portion 28A and an electrode guide hole portion 28B. The device-under-test-side guide portion 28A is set to have an approximately equal inside diameter dimension to that of an after-mentioned tip end portion 46 of a device-under-test-side plunger 35 of the contact 19. This enables the tip end portion 46 of the device-under-test-side plunger 35 to be inserted and supported in the device-under-test-side guide portion 28A and slide up and down in a stable manner without fluctuation.

The rim portion of the upper plate 17 is provided at two locations with pinholes 29. The pinholes 29 are holes to allow the positioning pins 30 to be inserted therein. The inside diameter of each pin hole 29 is set to have an approximately equal dimension to the outside diameter of each positioning pin 30 so that the positioning pin 30 may be fitted in the pin hole 29 without looseness. The positioning pins 30 pass through the pinholes 29 of the upper plate 17 and the pinholes 27 of the housing 16 to cause the upper plate 17 and the housing 16 to be positioned accurately.

The electrode guide hole portions 28B are provided respectively at positions corresponding to the bump electrodes 13 arranged on the lower side surface of the device under test 12. Each electrode guide hole portion 28B is formed in a recessed shape slightly larger than the outside dimension of the bump electrode 13. Thus, when the device under test 12 is mounted, the respective bump electrodes 13 of this device under test 12 are received in the respective electrode guide hole portions 28B so that contact end portions 46A of the device-under-test-side plungers 35 of the contacts 19 may electrically contact the respective bump electrodes 13. The upper plate 17 is pressed and fixed by the guide plate 18 in a state of being fitted in the upper plate fitting recess portion 23 of the housing 16. It is to be noted that the respective electrode guide hole portions 28B are not required in a case where the electrodes of the device under test 12 are not spherical but in flat-plate shapes.

The guide plate 18 is a member to receive, guide, position, and support the device under test 12 when the device under test 12 is mounted in the electrical connecting apparatus 11. The device under test 12 positioned and supported is thrust by a thrusting means (not shown) to cause the respective bump electrodes 13 thereof to be aligned with the respective contacts 19 and contact them each other. The guide plate 18 is entirely formed in a rectangular annular shape. The outer circumference of the guide plate 18 is set to be aligned with the outer circumference of the housing 16. The inner circumference of the guide plate 18 has an inclined surface portion 18A and an abutting surface portion 18B.

The inclined surface portion 18A is a part to receive and guide the device under test 12. The inclined surface portion 18A is located on the upper side of the inner circumference of the rectangular annular guide plate 18 and is formed to be inclined to open upward. The abutting surface portion 18B is a part to position and support the device under test 12 guided by the inclined surface portion 18A. The abutting surface portion 18B is located on the lower side of the inclined surface portion 18A and is set to have an approximately equal dimension to the dimension of the device under test 12. Thus, the device under test 12 is fitted in the abutting surface portion 18B to cause the device under test 12 to be positioned and supported accurately.

The guide plate 18 is provided at two opposed locations with pinholes 31. In each pin hole 31 is inserted a positioning pin 32 having an approximately equal outside diameter to the inside diameter of this pinhole 31. The housing 16 is provided at a position opposed to each pin hole 31 with a pin hole (not shown) having an equal inside diameter, and the positioning pins 32 pass from the pin holes 31 to the pin holes of the housing 16 to cause the housing 16 and the guide plate 18 to be positioned accurately.

The wiring board 15, the housing 16, and the guide plate 18 are fixed by penetrating bolts 33. Four penetrating bolts 33 are provided at four corners to fix the wiring board 15, the housing 16, and the guide plate 18 integrally.

Figure 8:
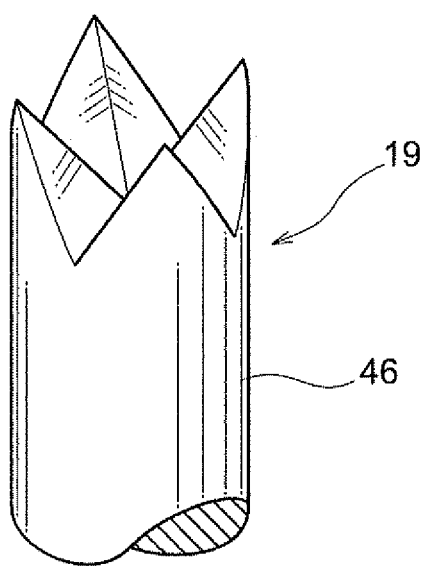
FIG. 8 is a perspective view showing a contact end portion of a device-under-test-side plunger of the electrical connecting apparatus according to the embodiment of the present invention.

The contact 19 is a member to respectively contact the bump electrode 13 of the device under test 12 and the contact pad 22 of the wiring board 15 and conduct electricity between them. The shape of the end portion of the contact 19 is arbitrarily set in accordance with the shape of a member to contact such as an electrode as described above. That is, the tip end portion 46 of the contact 19 is cut in a crown shape as the upper end portion in FIG. 7 or as shown in FIG. 8, or is formed in a conical shape as the lower end portion (tip end portion 39) in FIG. 7. Hereinafter, the contact 19 whose end portions are both formed in conical shapes will be described as an example based on FIGS. 1 and 9 to 20.

The contact 19 includes the board-side plunger 34 as a first plunger, the device-under-test-side plunger 35 as a second plunger, and a compression coil spring 36 as shown in FIG. 1.

Figure 14:
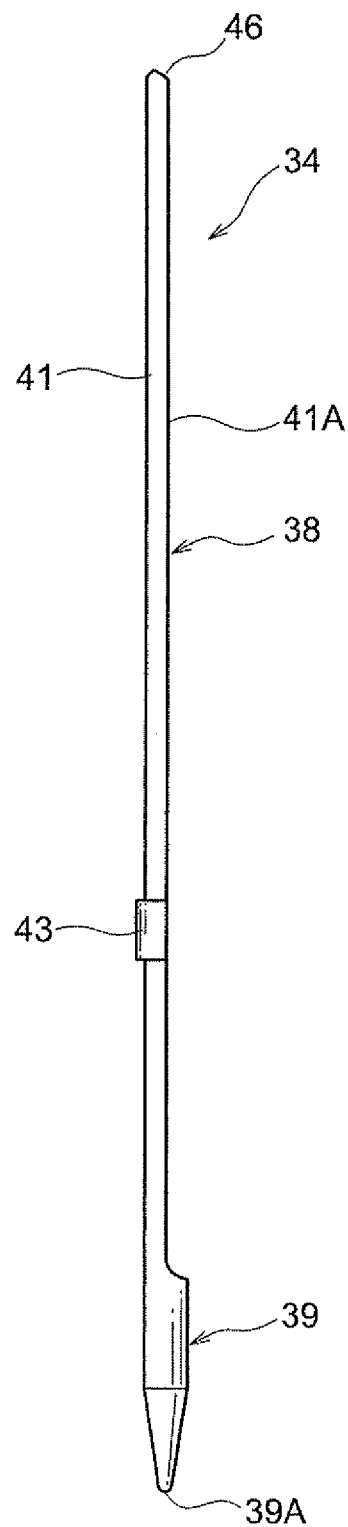
FIG. 14 is a side view showing a board-side plunger of the contact of the electrical connecting apparatus according to the embodiment of the present invention.
Figure 15:
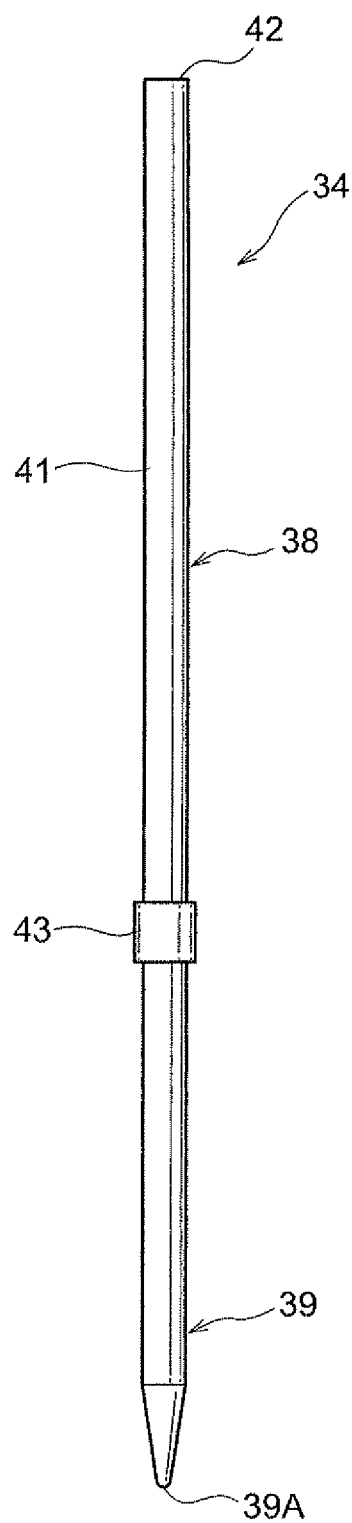
FIG. 15 is a front view showing the board-side plunger of the contact of the electrical connecting apparatus according to the embodiment of the present invention.

The board-side plunger 34 is a plunger to contact an electrode or the like (contact pad 22 of the wiring board 15 herein) as one member. The board-side plunger 34 is formed by processing a conductive material. For example, the board-side plunger 34 is produced by dicing, plating with use of a photolithographic technique, press work, or the like. The board-side plunger 34 includes a sliding portion 38 and a tip end portion 39 as shown in FIGS. 14 and 15.

The sliding portion 38 is a part to be slidably overlapped with an after-mentioned sliding portion 45 of the device-under-test-side plunger 35 and bring the board-side plunger 34 and the device-under-test-side plunger 35 into electrical contact with each other. The sliding portion 38 is set to have a length to be slidably supported in the device-under-test-side guide portion 28A of the device-under-test-side supporting hole 28 together with the tip end portion 46 of the other plunger 35. This causes the board-side plunger 34 to be supported at both end portions by the housing 16 and the upper plate 17 and slide in a stable manner. The sliding portion 38 includes a sliding bar portion 41, a rear end inserting portion 42, and a stopper 43.

The sliding bar portion 41 is a part to be slidably overlapped with the after-mentioned sliding portion 45 of the device-under-test-side plunger 35 and bring the board-side plunger 34 and the device-under-test-side plunger 35 into electrical contact with each other. The sliding bar portion 41 is provided on the proximal end side (upper side in FIG. 14) of the board-side plunger 34 and is formed in a halved shape. That is, the sliding bar portion 41 is formed in a bar shape having a semi-circular cross-section. The sliding bar portion 41 occupies the majority of the entire length of the board-side plunger 34. The tip end portion 39 is only a part of the board-side plunger 34 inserted in the board-side guide hole portion 25B of the housing 16 and just occupies approximately one-sixth of the entire length of the board-side plunger 34. The sliding bar portion 41 of the sliding portion 38 occupies approximately five-sixth of the entire length of the board-side plunger 34. The planar surface of the bar-like sliding bar portion 41 having a semi-circular cross-section is a sliding surface portion 41A. This sliding surface portion 41A of the board-side plunger 34 is adapted to contact an after-mentioned sliding surface portion 47A of the device-under-test-side plunger 35 with a large area in a stable manner while mutually sliding over it for electrical connection. The sliding bar portion 41 is slidably overlapped with a sliding bar portion 47 of the device-under-test-side plunger 35 and is inserted in the compression coil spring 36.

Figure 16:
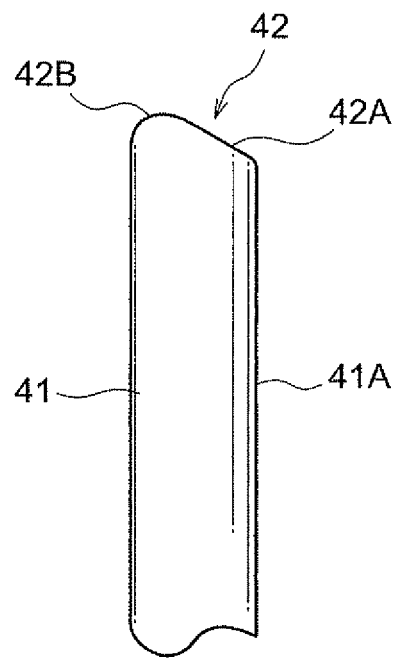
FIG. 16 is a side view showing a rear end inserting portion of the board-side plunger of the contact of the electrical connecting apparatus according to the embodiment of the present invention.
Figure 17:
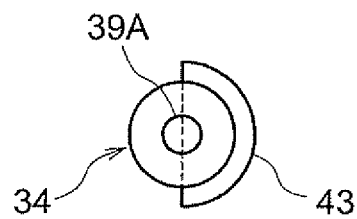
FIG. 17 is a plan view showing the board-side plunger of the contact of the electrical connecting apparatus according to the embodiment of the present invention.
Figure 18:
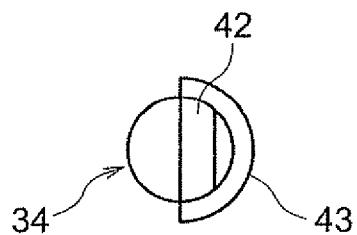
FIG. 18 is a bottom view showing the board-side plunger of the contact of the electrical connecting apparatus according to the embodiment of the present invention.
Figure 19:
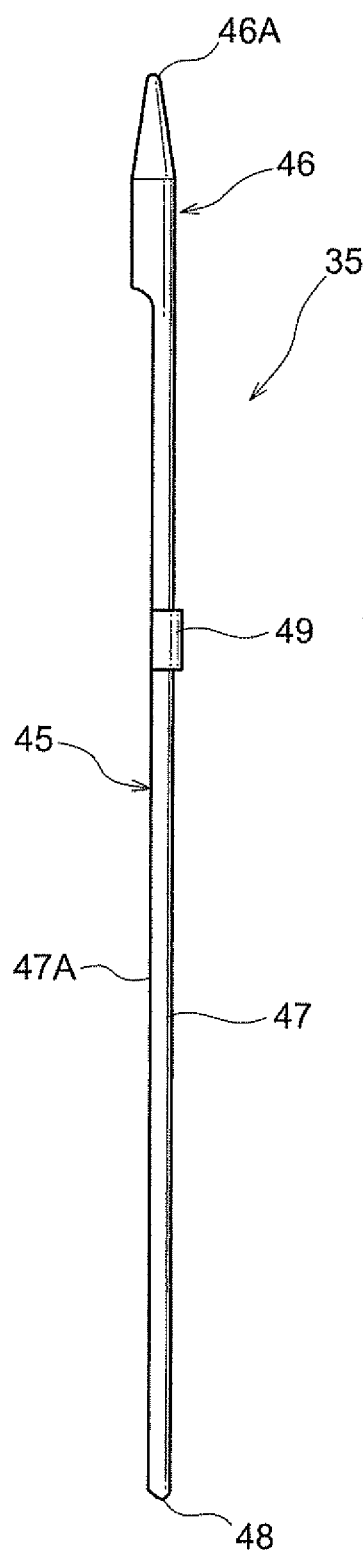
FIG. 19 is a side view showing the device-under-test-side plunger of the contact of the electrical connecting apparatus according to the embodiment of the present invention.
Figure 20:
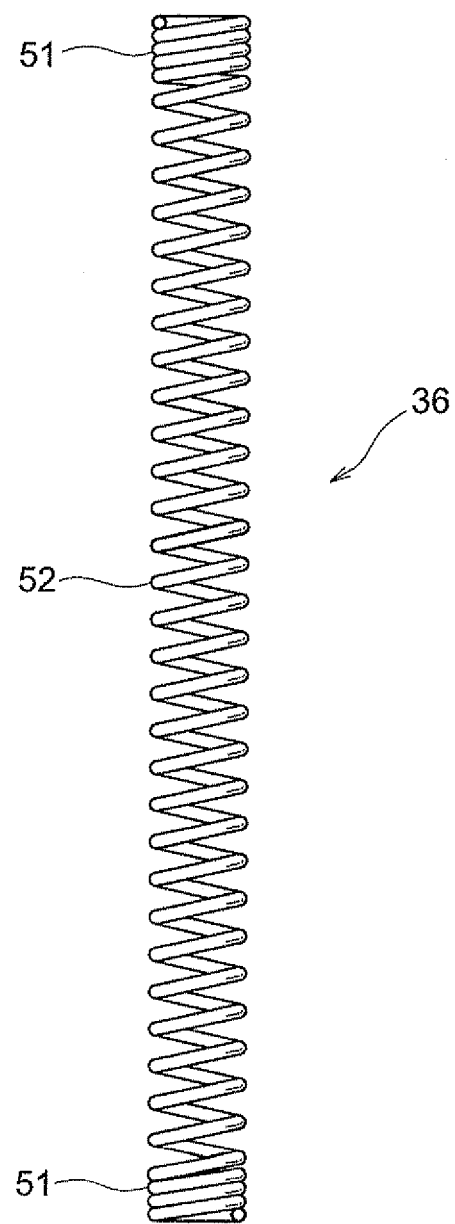
FIG. 20 is a side view showing a compression coil spring of the contact of the electrical connecting apparatus according to the embodiment of the present invention.

The rear end inserting portion 42 is a part to allow the sliding portion 38 of the board-side plunger 34 and the sliding portion 45 of the device-under-test-side plunger 35 to be inserted in the compression coil spring 36 smoothly. The rear end inserting portion 42 includes a linear chamfered portion 42A and an R chamfered portion 42B as shown in FIG. 16. The linear chamfered portion 42A is a chamfered portion to allow the sliding bar portion 41 of the board-side plunger 34 and the sliding bar portion 47 of the device-under-test-side plunger 35 to be inserted in the compression coil spring 36 smoothly without getting stuck with each other when they are to be inserted in it respectively. The R chamfered portion 42B is a chamfered portion to allow the sliding bar portion 41 of the board-side plunger 34 and the sliding bar portion 47 of the device-under-test-side plunger 35 to be inserted in the compression coil spring 36 smoothly without getting stuck in the inside of the compression coil spring 36 when they are to be inserted in it respectively.

The linear chamfered portion 42A occupies two-third to three-fourth of the sliding bar portion 41 in the thickness direction. Thus, when the sliding bar portion 41 of the board-side plunger 34 and the sliding bar portion 47 of the device-under-test-side plunger 35 are to be inserted in the compression coil spring 36 respectively, the respective linear chamfered portions 42A contact and are displaced from each other to enable the respective sliding surface portions 41A and 47A to contact reliably. This facilitates assembling of the contact 19.

The R chamfered portion 42B occupies one-third to one-fourth of the sliding bar portion 41 in the thickness direction. Curving the surface at the R chamfered portion 42B allows the sliding bar portion 41 of the board-side plunger 34 and the sliding bar portion 47 of the device-under-test-side plunger 35 to be inserted in the compression coil spring 36 smoothly without getting stuck in the inside surface of the compression coil spring 36 when they are to be inserted in it respectively.

The stopper 43 is a member to abut on the end portion of the compression coil spring 36. By the compression coil spring 36 abutting on the stopper 43, the board-side plunger 34 and the device-under-test-side plunger 35 are biased in directions to be away from each other (directions in which the contact 19 expands). The stopper 43 is also formed to be larger than the board-side guide hole portion 25B of the supporting hole 25 and is located in the intermediate hole portion 25A to prevent the board-side plunger 34 from falling off from the board-side guide hole portion 25B when it abuts on the end portion of the board-side guide hole portion 25B.

The tip end portion 39 is a part to contact the contact pad 22 of the wiring board 15. The tip end portion 39 is provided on the tip end side of the board-side plunger 34 and is slidably inserted and supported in the board-side guide hole portion 25B of the housing 16. The tip end portion 39 is formed in a circular bar shape having an approximately equal outside diameter to the inside diameter of the board-side guide hole portion 25B of the housing 16 so as to slide in the board-side guide hole portion 25B smoothly without looseness. The tip end side of the tip end portion 39 is provided with the contact end portion 39A formed in a conical shape. This contact end portion 39A is adapted to contact the contact pad 22 of the wiring board 15 directly.

The device-under-test-side plunger 35 is a member to contact the other member (bump electrode 13) in a state of being overlapped with the board-side plunger 34 and conduct electricity between one member and the other member in cooperation with the board-side plunger 34. This device-undertest-side plunger 35 is configured equally to the board-side plunger 34. That is, the device-under-test-side plunger 35 includes the sliding portion 45, the tip end portion 46, the sliding bar portion 47, a rear end inserting portion 48, and a stopper 49. These members have similar configurations and exert similar effects to those of the aforementioned board-side plunger 34.

The compression coil spring 36 is a spring to cover the outer circumferences of the aforementioned board-side plunger 34 and the aforementioned device-under-test-side plunger 35 overlapped with each other and support the respective plungers 34 and 35 relatively slidably. The compression coil spring 36 is configured to include close-contact winding portions 51 located on both ends thereof and supporting the respective sliding portions 38 and 45 overlapped with each other mutually elastically and a spring portion 52 located between the respective close-contact winding portions 51 and expanding and contracting elastically. The inside diameter of the compression coil spring 36 is set to be slightly smaller than the outside diameter of the respective sliding portions 38 and 45 in a mutually overlapped state to support the respective sliding portions 38 and 45. Thus, the close-contact winding portions 51 support the respective sliding portions 38 and 45 with relatively strong forces since they are wound closely with no space. The spring portion 52 supports the respective sliding portions 38 and 45 with a weak force since it is wound with spaces and gives a biasing force to separate the board-side plunger 34 and the device-under-test-side plunger 35 from each other.

Meanwhile, the outside diameter of each of the board-side plunger 34 and the device-under-test-side plunger 35 is approximately 0.04 mm, the outside diameter of the compression coil spring 36 is approximately 0.06 mm, the inside diameter of the compression coil spring 36 is approximately 0.035 mm, and the wire diameter of the compression coil spring 36 is approximately 0.0125 mm. In this manner, since the board-side plunger 34 and the device-under-test-side plunger 35 are extremely small, they are formed in special shapes as described above.

In the electrical connecting apparatus 11 configured as above, the contacts 19 are supported by the housing 16 and the upper plate 17. Each contact 19 is inserted in the supporting hole 25 of the housing 16, and the board-side plunger 34 of the contact 19 is inserted in the board-side guide hole portion 25B of the supporting hole 25. The wiring board 15 is attached to the lower side of the housing 16. Thus, each contact pad 22 of the wiring board 15 contacts the contact end portion 39A of the board-side plunger 34, and the board-side plunger 34 is pressed upward. At this time, the board-side plunger 34 is supported at the tip end portion 39 thereof in the board-side guide hole portion 25B and supported at the rear end inserting portion 42 thereof in the device-under-test-side guide portion 28A of the device-under-test-side supporting hole 28 to slide upward in a stable manner without fluctuation.

At this time, the stopper 49 of the device-under-test-side plunger 35 supports the upper end of the compression coil spring 36 in a state of abutting on the lower end portion of the device-under-test-side guide portion 28A of the device-under-test-side supporting hole 28. By the compression coil spring 36 supported by the stopper 49, the board-side plunger 34 is biased downward, and the contact end portion 39A of the board-side plunger 34 is pressed to the contact pad 22.

The tip end portion 46 of the device-under-test-side plunger 35 is inserted and supported in the device-under-test-side guide portion 28A of the upper plate 17 to enable to slide up and down in a stable manner without fluctuation. The contact end portion 46A of the tip end portion 46 is projected upward from the upper side surface of the upper plate 17.

Figure 9:
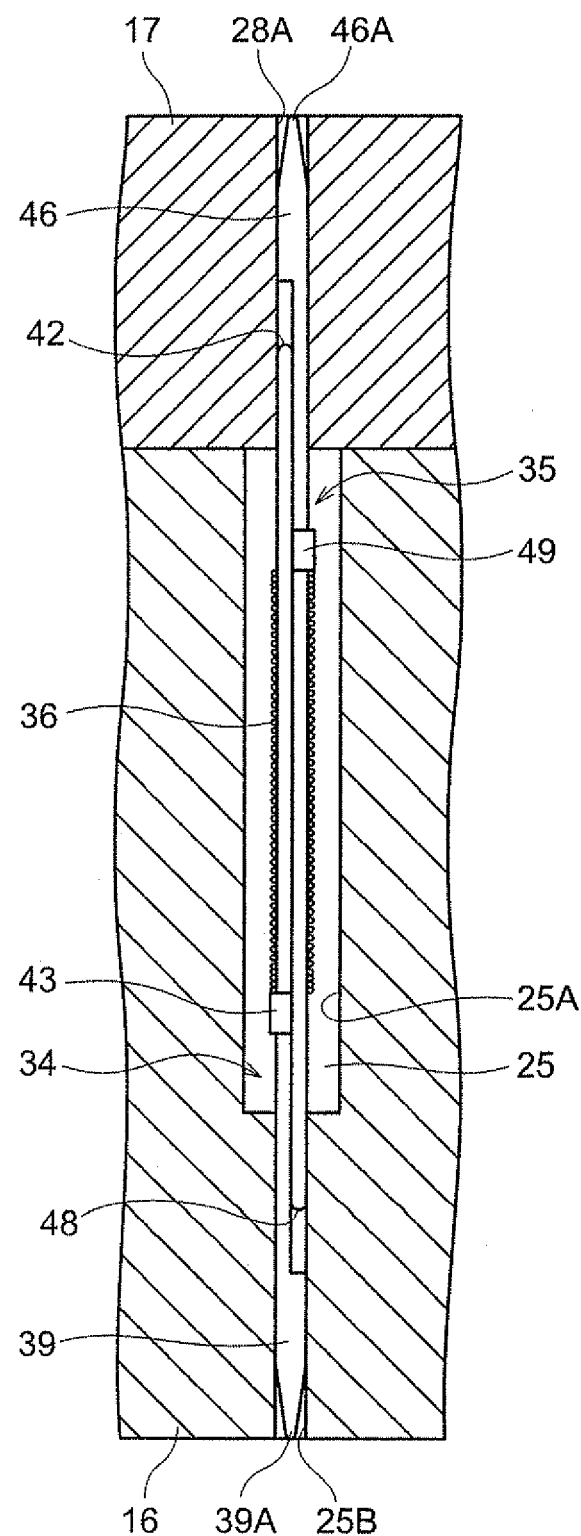
FIG. 9 is a cross sectional view of a main part showing a state in which respective plungers of the electrical connecting apparatus according to the embodiment of the present invention are housed.
Figure 10:
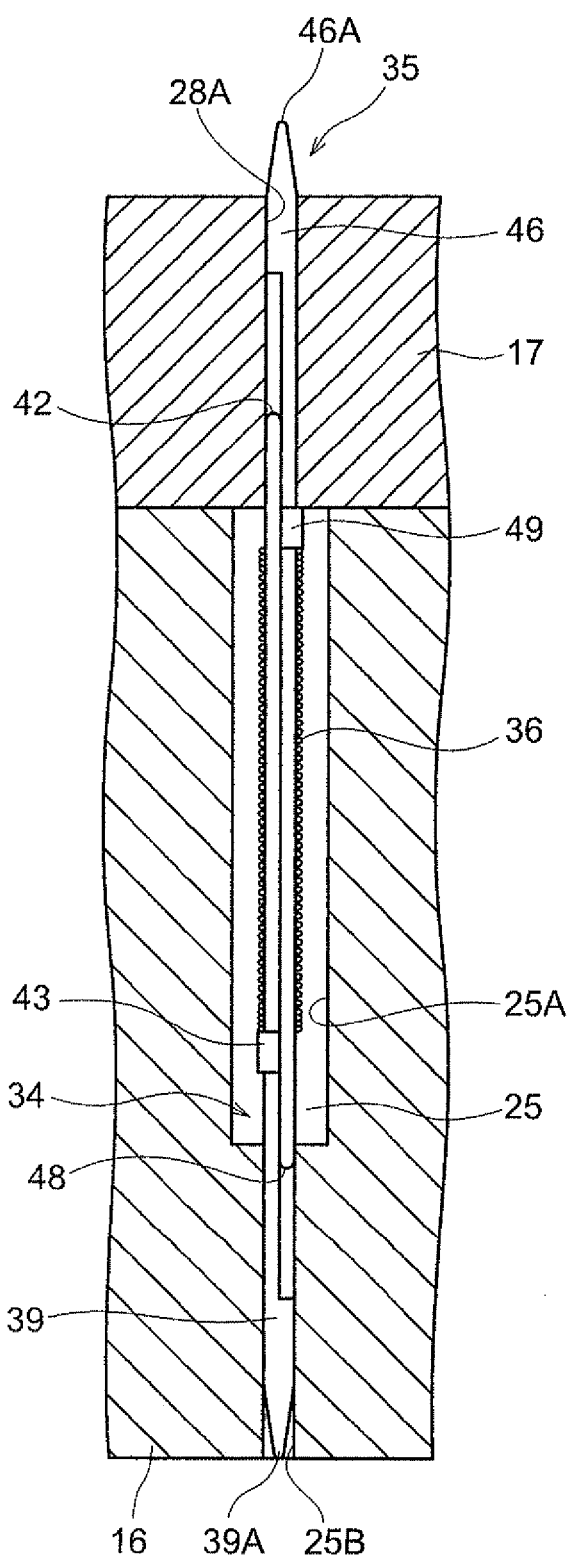
FIG. 10 is a cross sectional view of a main part showing a state in which the device-under-test-side plunger of the electrical connecting apparatus according to the embodiment of the present invention is projected.
Figure 11:
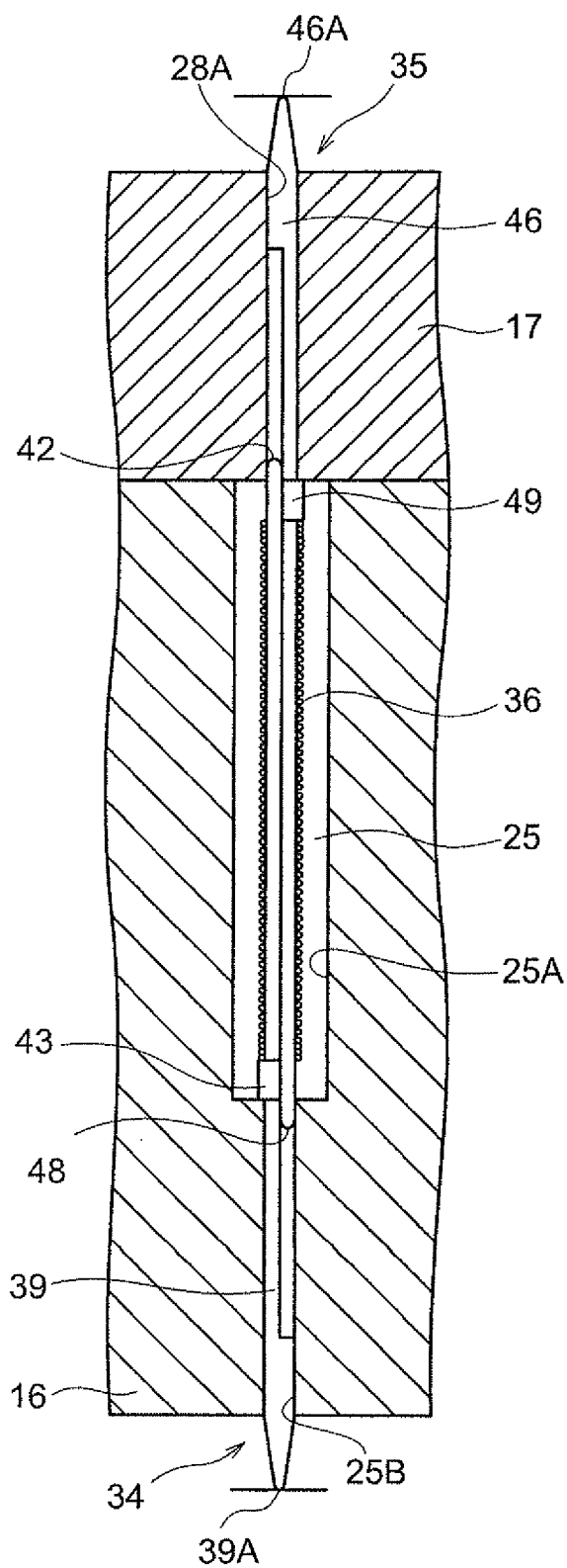
FIG. 11 is a cross sectional view of a main part showing a state in which the respective plungers of the electrical connecting apparatus according to the embodiment of the present invention are projected.
Figure 12:
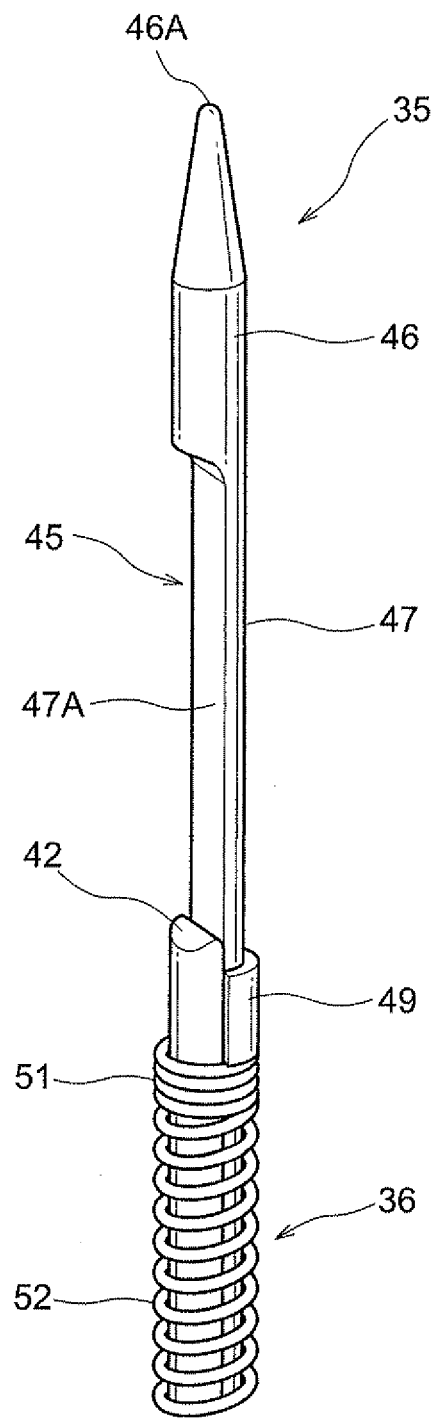
FIG. 12 is a perspective view showing an upper portion of the contact of the electrical connecting apparatus according to the embodiment of the present invention.
Figure 13:
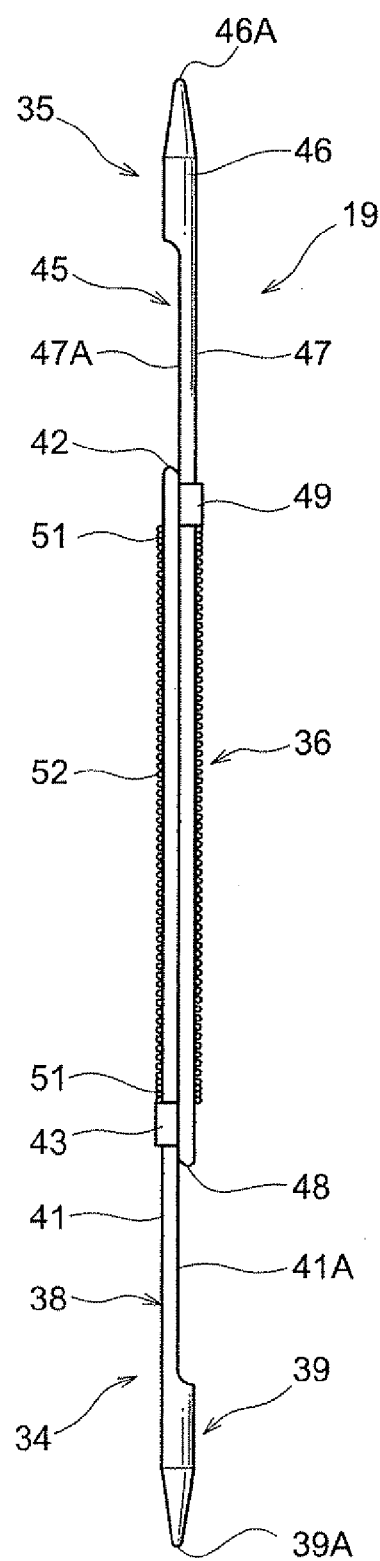
FIG. 13 is a partially broken side view showing the contact of the electrical connecting apparatus according to the embodiment of the present invention.

Specific operations of the board-side plunger 34 and the device-under-test-side plunger 35 are shown in FIGS. 9, 10, and 11. In a state where the board-side plunger 34 and the device-under-test-side plunger 35 are housed in the housing 16 and the upper plate 17 as in FIG. 9, when the device-under-test-side plunger 35 is pressed upward as in FIG. 10, the contact end portion 46A is projected to the upper side of the upper plate 17. At this time, the rear end inserting portion 48 of the device-under-test-side plunger 35 is slidably supported in the board-side guide hole portion 25B of the supporting hole 25. Also, when the board-side plunger 34 is pressed downward as in FIG. 11, the contact end portion 39A is projected to the lower side of the housing 16. At this time, the rear end inserting portion 42 of the board-side plunger 34 is slidably supported in the device-under-test-side guide portion 28A of the device-under-test-side supporting hole 28. This causes the board-side plunger 34 and the device-under-test-side plunger 35 to slide up and down in a stable manner without fluctuation and contact the contact pad 22 and the bump electrode 13 reliably.

The electrical connecting apparatus 11 in which the contacts 19 have been incorporated is used in the following manner.

First, the device under test 12 is mounted in the electrical connecting apparatus 11. At this time, the device under test 12 is mounted in the guide plate 18. That is, the device under test 12 is mounted on the abutting surface portion 18B while being positioned along the inclined surface portion 18A. Thus, the bump electrodes 13 of the device under test 12 are received in the electrode guide hole portions 28B of the upper plate 17.

In this state, when the device under test 12 is pressed down, each bump electrode 13 contacts the contact end portion 46A of each device-under-test-side plunger 35 for electrical connection.

At this time, the device-under-test-side plunger 35 is slidably supported at the tip end portion 46 thereof in the device-under-test-side guide portion 28A of the device-under-test-side supporting hole 28 and slidably supported at the rear end inserting portion 48 thereof in the board-side guide hole portion 25B of the supporting hole 25. This causes the device-under-test-side plunger 35 to slide up and down in a stable manner without fluctuation and causes the contact end portion 46A to contact the bump electrode 13 reliably.

At this time, the board-side plunger 34 and the device-under-test-side plunger 35 are supported by the compression coil spring 36, and the sliding surface portions 41A and 47A slide on each other with large areas for reliable electrical contact.

Also, even when a force is applied to the contact end portion 46A in a misaligned direction in a case where the bump electrode 13 is deformed or the like, the contact end portion 46A contacts the bump electrode 13 in a stable manner without misalignment since the device-under-test-side plunger 35 is supported in the board-side guide hole portion 25B and the device-under-test-side guide portion 28A.

This causes the respective members (the contact pads 22 of the wiring board 15 and the bump electrodes 13) to be electrically connected reliably by the contacts 19. In this state, electrical signals and the like are transmitted between the respective members via the contacts 19.

As described above, since the board-side plunger 34 and the device-under-test-side plunger 35 electrically contact each other reliably, and the respective plungers 34 and 35 are supported at the upper and lower end portions thereof in a stable manner, electrical contact characteristics between the respective members (the contact pads 22 of the wiring board 15 and the bump electrodes 13) are drastically improved.

Also, since the contact 19 has few causes for failures because it has a small number of parts and has a simple structure, durability is improved. Each of the plungers 34 and 35 can be manufactured easily by a photolithographic technique or the like, and cost reduction is enabled since the contact 19 has a simple structure and has a small number of parts.

Since the contact 19 has a small number of parts and has a simple structure, the electrical contact characteristics can be maintained in favorable conditions for a long period, and the durability is improved. Consequently, reliability of the contact 19 and the electrical connecting apparatus 11 is improved.

MODIFICATION EXAMPLES

Figure 21:
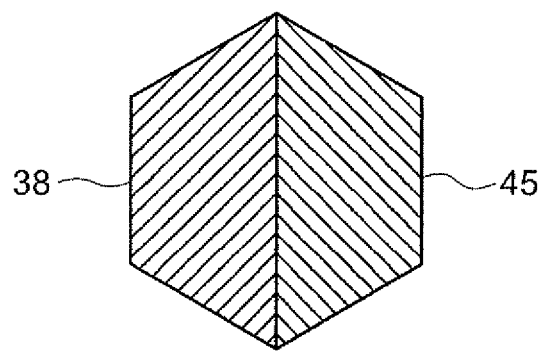
FIG. 21 is a cross-sectional view of a main part showing a first modification example of the present invention.
Figure 22:
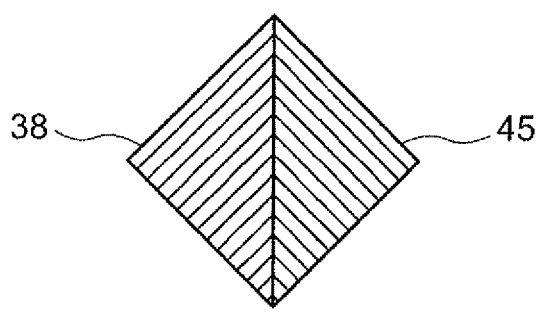
FIG. 22 is a cross-sectional view of a main part showing a second modification example of the present invention.

Although the board-side plunger 34 and the device-under-test-side plunger 35 are formed to have circular cross-sections and semi-circular cross-sections in the aforementioned embodiments, they may be formed to have polygonal cross-sections. For example, as shown in FIG. 21, the tip end portions 39 and 46 may have cross-sections formed in hexagonal shapes while the sliding portions 38 and 45 may have cross-sections formed in halved shapes of the aforementioned hexagonal shapes. Also, as shown in FIG. 22, the tip end portions 39 and 46 may have cross-sections formed in quadrangular shapes while the sliding portions 38 and 45 may have cross-sections formed in halved shapes of the aforementioned quadrangular shapes. Further, they may be formed in other polygonal shapes. These cases can exert similar effects to those of the aforementioned embodiments.

Industrial Applicability

The contact of the present invention can be used in general apparatuses that are brought into contact with electrodes provided in a wiring board, a semiconductor integrated circuit, or the like.

The electrical connecting apparatus can be applied to all apparatuses that can use the contact of the present invention.

The invention claimed is:

1. A contact comprising:
    a first plunger contacting one member;
    a second plunger contacting the other member in a state of being overlapped with the first plunger and conducting electricity between the one member and the other member in cooperation with the first plunger; and
    a compression coil spring covering outer circumferences of the first plunger and the second plunger overlapped with each other and supporting the respective plungers relatively slidably,
    wherein the first plunger and the second plunger include tip end portions provided on tip end sides, slidably supported, and contacting the respective members, the first and second plungers further including sliding portions formed in halved shapes of the respective plungers that slidably overlap and contact each other, and that are inserted in the compression coil spring, and
    wherein each of the sliding portions is set to have a length to be slidably supported together with the tip end portion of the other plunger, and
    wherein the compression coil spring includes close-contact winding portions located on both ends thereof and supporting the respective sliding portions overlapped with each other mutually elastically and a spring portion located between the respective close-contact winding portions and expanding and contracting elastically.

2. An electrical connecting apparatus contacting electrodes of a device under test and performing a test, comprising:
    contacts disposed at positions corresponding to the respective electrodes of the device under test and contacting the respective electrodes for electrical conduction,
    wherein the contacts according to claim 1 are used as the contacts.

3. The contact according to claim 1, wherein the first plunger and the second plunger are formed to have circular cross-sections at the tip end portions and semi-circular cross-sections at the sliding portions.

4. The contact according to claim 1, wherein the first plunger and the second plunger have cross-sections formed in polygonal shapes at the tip end portions and cross-sections formed in halved shapes of the polygonal shapes at the sliding portions.

5. The contact according to claim 1, wherein the sliding portion includes a sliding bar portion slidably overlapped with the other plunger and bringing the respective plungers into electrical contact with each other, a rear end inserting portion chamfered and allowing the respective plungers to be inserted in the compression coil spring smoothly, and a stopper abutting on an end portion of the compression coil spring.

6. An electrical connecting apparatus contacting electrodes of a device under test and performing a test, comprising:
    contacts disposed at positions corresponding to the respective electrodes of the device under test and contacting the respective electrodes for electrical conduction,
    wherein the contacts according to claim 3 are used as the contacts.

7. An electrical connecting apparatus contacting electrodes of a device under test and performing a test, comprising:
    contacts disposed at positions corresponding to the respective electrodes of the device under test and contacting the respective electrodes for electrical conduction,
    wherein the contacts according to claim 4 are used as the contacts.

8. The contact according to claim 3, wherein the sliding portion includes a sliding bar portion slidably overlapped with the other plunger and bringing the respective plungers into electrical contact with each other, a rear end inserting portion chamfered and allowing the respective plungers to be inserted in the compression coil spring smoothly, and a stopper abutting on an end portion of the compression coil spring.

9. The contact according to claim 4, wherein the sliding portion includes a sliding bar portion slidably overlapped with the other plunger and bringing the respective plungers into electrical contact with each other, a rear end inserting portion chamfered and allowing the respective plungers to be inserted in the compression coil spring smoothly, and a stopper abutting on an end portion of the compression coil spring.

* * * * *